(12) United States Patent
Rothstein et al.

(10) Patent No.: US 8,516,156 B1
(45) Date of Patent: *Aug. 20, 2013

(54) ADAPTIVE COMPRESSION

(75) Inventors: Jesse A. Rothstein, Seattle, WA (US);
David D. Schmitt, Seattle, WA (US);
Arindum Mukerji, Seattle, WA (US)

(73) Assignee: F5 Networks, Inc., Seattle, WA (US)

( * ) Notice: Subject to any disclaimer, the term of this patent is extended or adjusted under 35 U.S.C. 154(b) by 104 days.

This patent is subject to a terminal disclaimer.

(21) Appl. No.: 12/838,280

(22) Filed: Jul. 16, 2010

Related U.S. Application Data

(63) Continuation of application No. 11/243,629, filed on Oct. 5, 2005, now Pat. No. 7,783,781.

(60) Provisional application No. 60/706,155, filed on Aug. 5, 2005.

(51) Int. Cl.
*G06F 15/16* (2006.01)

(52) U.S. Cl.
USPC .......................................................... 709/247

(58) Field of Classification Search
USPC ................................. 709/203, 230, 246–247
See application file for complete search history.

(56) References Cited

U.S. PATENT DOCUMENTS

| | | | |
|---|---|---|---|
| 4,021,782 A | 5/1977 | Hoerning | |
| 4,054,951 A | 10/1977 | Jackson et al. | |
| 4,316,222 A | 2/1982 | Subramaniam et al. | |
| 4,386,416 A | 5/1983 | Giltner et al. | |
| 4,593,324 A | 6/1986 | Ohkubo et al. | |
| 4,626,829 A | 12/1986 | Hauck | |
| 4,629,829 A | 12/1986 | Puhl et al. | |
| 4,701,745 A | 10/1987 | Waterworth et al. | |
| 4,862,167 A | 8/1989 | Copeland, III | |
| 4,876,541 A | 10/1989 | Storer | |
| 4,890,282 A | 12/1989 | Lambert et al. | |

(Continued)

FOREIGN PATENT DOCUMENTS

| | | |
|---|---|---|
| EP | 0 929 173 A2 | 7/1999 |
| EP | 0 947 104 B1 | 11/2002 |

(Continued)

OTHER PUBLICATIONS

Pierzchala, Stephen, "Compressing Web Content with mod_gzip and mod_deflate", Linux Journal, pp. 1-10, Apr. 26, 2004. Can be found at http://linuxjournal.com/article/6802.

(Continued)

*Primary Examiner* — Jason Recek
(74) *Attorney, Agent, or Firm* — Frommer Lawrence & Haug LLP; Jamie L. Wiegand

(57) ABSTRACT

A method, system, and apparatus are directed towards compression of content over a network. The content may include content length information, such as within a header. In one embodiment, a portion of the content may be compressed to approximately fill a buffer of a predefined size. If there remains additional uncompressed content, a new content length may be determined based in part on the length of the compressed content and the remaining uncompressed content. The buffered content and the new content length may then be forwarded in response to the request. The remaining uncompressed content may be split into predefined blocks using identity compression. Identity compression may then be applied to the remaining uncompressed content which is then forwarded to a destination in response to the request.

18 Claims, 4 Drawing Sheets

(56) References Cited

U.S. PATENT DOCUMENTS

| | | | |
|---|---|---|---|
| 4,891,643 A | 1/1990 | Mitchell et al. |
| 4,897,717 A | 1/1990 | Hamilton et al. |
| 4,906,991 A | 3/1990 | Fiala et al. |
| 4,971,407 A | 11/1990 | Hoffman |
| 4,988,998 A | 1/1991 | O'Brien |
| 5,003,307 A | 3/1991 | Whiting et al. |
| 5,016,009 A | 5/1991 | Whiting et al. |
| 5,109,433 A | 4/1992 | Notenboom |
| 5,126,739 A | 6/1992 | Whiting et al. |
| 5,146,221 A | 9/1992 | Whiting et al. |
| 5,150,430 A | 9/1992 | Chu |
| 5,155,484 A | 10/1992 | Chambers, IV |
| 5,167,034 A | 11/1992 | MacLean, Jr. et al. |
| 5,212,742 A | 5/1993 | Normile et al. |
| 5,249,053 A | 9/1993 | Jain |
| 5,276,898 A | 1/1994 | Kiel et al. |
| 5,280,600 A | 1/1994 | Van Maren et al. |
| 5,293,388 A | 3/1994 | Monroe et al. |
| 5,303,326 A | 4/1994 | Dean et al. |
| 5,319,682 A | 6/1994 | Clark |
| 5,333,212 A | 7/1994 | Ligtenberg |
| 5,341,440 A | 8/1994 | Earl et al. |
| 5,367,629 A | 11/1994 | Chu et al. |
| 5,376,968 A | 12/1994 | Wu et al. |
| 5,379,036 A | 1/1995 | Storer |
| 5,410,671 A | 4/1995 | Elgamal et al. |
| 5,414,425 A | 5/1995 | Whiting et al. |
| 5,463,390 A | 10/1995 | Whiting et al. |
| 5,479,587 A | 12/1995 | Campbell et al. |
| 5,488,364 A | 1/1996 | Cole |
| 5,488,483 A | 1/1996 | Murayama |
| 5,504,842 A | 4/1996 | Gentile |
| 5,506,944 A | 4/1996 | Gentile |
| 5,539,865 A | 7/1996 | Gentile |
| 5,542,031 A | 7/1996 | Douglass et al. |
| 5,544,290 A | 8/1996 | Gentile |
| 5,546,395 A | 8/1996 | Sharma et al. |
| 5,546,475 A | 8/1996 | Bolle et al. |
| 5,553,160 A | 9/1996 | Dawson |
| 5,559,978 A | 9/1996 | Spilo |
| 5,615,287 A | 3/1997 | Fu et al. |
| 5,638,498 A | 6/1997 | Tyler et al. |
| 5,646,946 A | 7/1997 | VanderMeer et al. |
| 5,768,445 A | 6/1998 | Troeller et al. |
| 5,768,525 A | 6/1998 | Kralowetz et al. |
| 5,774,715 A | 6/1998 | Madany et al. |
| 5,805,932 A | 9/1998 | Kawashima et al. |
| 5,850,565 A | 12/1998 | Wightman et al. |
| 5,874,907 A | 2/1999 | Craft |
| 5,884,269 A | 3/1999 | Cellier et al. |
| 5,892,847 A | 4/1999 | Johnson |
| 5,903,676 A | 5/1999 | Wu et al. |
| 5,909,250 A | 6/1999 | Hardiman |
| 5,951,623 A | 9/1999 | Reynar et al. |
| 5,991,515 A | 11/1999 | Fall et al. |
| 6,061,473 A | 5/2000 | Chen et al. |
| 6,070,179 A | 5/2000 | Craft |
| 6,101,547 A | 8/2000 | Mukherjee et al. |
| 6,138,156 A | 10/2000 | Fletcher et al. |
| 6,157,743 A | 12/2000 | Goris et al. |
| 6,178,489 B1 | 1/2001 | Singh |
| 6,310,693 B1 | 10/2001 | Hiraike |
| 6,314,095 B1 | 11/2001 | Loa |
| 6,389,160 B1 | 5/2002 | Chui et al. |
| 6,473,458 B1 | 10/2002 | Shimizu et al. |
| 6,477,201 B1 | 11/2002 | Wine et al. |
| 6,583,887 B1 | 6/2003 | Clouthier et al. |
| 6,631,240 B1 | 10/2003 | Salesin et al. |
| 6,697,813 B1 | 2/2004 | Backman |
| 6,728,785 B1 | 4/2004 | Jungck |
| 6,763,031 B1 | 7/2004 | Gibson et al. |
| 6,879,631 B1 | 4/2005 | Schultz et al. |
| 6,882,753 B2 | 4/2005 | Chen et al. |
| 6,904,176 B1 | 6/2005 | Chui et al. |
| 6,907,071 B2 | 6/2005 | Frojdh et al. |
| 6,914,903 B1 | 7/2005 | Miyazaki et al. |
| 6,925,467 B2 | 8/2005 | Gu et al. |
| 7,088,387 B1 | 8/2006 | Freeman et al. |
| 7,099,506 B2 | 8/2006 | Mishima |
| 7,161,506 B2 | 1/2007 | Fallon |
| 7,450,514 B2 | 11/2008 | Suh |
| 7,477,688 B1 | 1/2009 | Zhang et al. |
| 7,564,861 B1 | 7/2009 | Subbiah |
| 7,673,321 B2 | 3/2010 | Yurt et al. |
| 7,783,781 B1 | 8/2010 | Rothstein et al. |
| 2002/0090140 A1 | 7/2002 | Thirsk |
| 2003/0135631 A1* | 7/2003 | Li et al. ............ 709/231 |
| 2003/0146907 A1 | 8/2003 | Boals et al. |
| 2003/0169934 A1 | 9/2003 | Naito |
| 2003/0174769 A1* | 9/2003 | Nagumo et al. ....... 375/240.02 |
| 2004/0001207 A1 | 1/2004 | Nishimura |
| 2004/0008896 A1 | 1/2004 | Suzuki |
| 2004/0056783 A1* | 3/2004 | Fallon ................ 341/51 |
| 2004/0091042 A1 | 5/2004 | Herath |
| 2004/0103215 A1 | 5/2004 | Ernst et al. |
| 2004/0141655 A1 | 7/2004 | Aoyahi |
| 2004/0179284 A1 | 9/2004 | Martin |
| 2004/0190635 A1 | 9/2004 | Ruehle |
| 2004/0199740 A1* | 10/2004 | Makela et al. ............ 711/170 |
| 2004/0210668 A1 | 10/2004 | Garakani et al. |
| 2005/0069214 A1 | 3/2005 | Hayashi |
| 2005/0071579 A1 | 3/2005 | Luick |
| 2005/0132045 A1 | 6/2005 | Hornback et al. |
| 2005/0200631 A1 | 9/2005 | Pan et al. |
| 2005/0219252 A1 | 10/2005 | Buxton et al. |
| 2006/0045367 A1 | 3/2006 | Chao et al. |
| 2006/0215912 A1* | 9/2006 | Liu et al. ............ 382/232 |
| 2007/0038738 A1 | 2/2007 | Iyengar |
| 2007/0096954 A1 | 5/2007 | Boldt et al. |
| 2007/0291131 A1 | 12/2007 | Suzuki et al. |
| 2008/0034119 A1 | 2/2008 | Verzunov et al. |
| 2008/0178298 A1* | 7/2008 | Arai et al. ............ 726/29 |

FOREIGN PATENT DOCUMENTS

| | | |
|---|---|---|
| EP | 1 276 324 A1 | 1/2003 |
| EP | 1 424 779 A1 | 6/2004 |
| EP | 1 434 437 A2 | 6/2004 |
| WO | 00/07083 A1 | 2/2000 |
| WO | 01 71701 A2 | 9/2001 |
| WO | 03/073719 A1 | 9/2003 |
| WO | 2004/036501 A2 | 4/2004 |

OTHER PUBLICATIONS

Roelofs, Greg, zlib A massively Spiffy Yet Delicately Unobtrusive Compression Library (Also Free, Not to Mention Unencumbered by Patents), pp. 1-5, Last updated on Aug. 7, 2005. Can be found at http://www.zlib.net/.

Seshan, Srinivasan, et al., "SPAND: Shared Passive Network Performance Discovery", USENIX Symposium on Internet Technologies and Systems, pp. 1-13, Dec. 1997.

Roelofs, Greg, et al., "zlib Frequently Asked Questions", pp. 1-7, last modified Jul. 18, 2005 by Mark Adler © 1996-2005. Can be found at http://www.zlib.net/zlib_faq.html#faq38.

Slattery, M.J. et al., "Design Considerations for the ALDS Cores", IBM Journal of Research and Development, 6 pages, Oct. 23, 1998.

Mertz, David, "A Data Compression Primer, Theory and Strategy of Data Representation", IBM developerWorks, 5 pages, May 1, 2001.

Phamdo, Nam, "Lossless Data Compression", Data-Compression. com, 5 pages, Copyright 2000-2001.

"LZ77 Compression", FOLDOC, 2 pages, Apr. 7, 1995.

Official Communication for U.S. Appl. No. 11/243,629, mailed on Apr. 7, 2009.

Official Communication for U.S. Appl. No. 11/243,629, mailed on Dec. 9, 2009.

Official Communication for U.S. Appl. No. 11/243,629, mailed on Feb. 18, 2010.

Official Communication for U.S. Appl. No. 11/243,629, mailed on Jun. 28, 2010.

Official Communication for U.S. Appl. No. 11/376,913, mailed on Jul. 9, 2010.

Official Communication for U.S. Appl. No. 11/376,913 mailed Dec. 21, 2011.
Zebrose, K. L. "Integrating Hardware Accelerators into Internetworking Switches." Telco Systems, Nov. 1993, 10 pages.
"Readme," PowerQuest Corporation, 1994-1999, 6 pages.
Official Communication for U.S. Appl. No. 11/376,913 mailed Jul. 9, 2010.
Official Communication for U.S. Appl. No. 11/376,913 mailed Dec. 22, 2010.
Official Communication for U.S. Appl. No. 11/376,913 mailed Jun. 7, 2011.
Official Communication for U.S. Appl. No. 11/376,913 mailed May 31, 2012.
Cheng, J.M., et al. "A fast, highly reliable data compression chip and algorithm for storage systems," IBM, vol. 40, No. 6, Nov. 1996, 11 pgs.
Simpson, W. "The Point-To-Point Protocol (PPP)," RFC 1661, Jul. 1994, 54 pgs.
Schneider, K., et al. "PPP for Data Compression in Data Circuit-Terminating Equipment (DCE)," RFC 1976, Aug. 1996, 10 pgs.
Castineyra, I., et al. "The Nimrod Routing Architecture," RFC 1992, 1996, 27 pgs.
Degermark, Mikael et al., "Low-Loss TCP/IP Header Compression for Wireless Networks," J.C. Baltzar AG, Science Publishers, Oct. 1997, pp. 375-387.
"Direct Access Storage Device Compression and Decompression Data Flow," IBM Technical Disclosure Bulletin, vol. 38, No. 11, Nov. 1995, pp. 291-295.
"Drive Image Professional for DOS, OS/2 and Windows," WSDC Download Guide, http://wsdcds01.watson.ibm.com/WSDC.nsf/Guides/Download/Applications-DriveImage.htm, accessed Nov. 22, 1999, 4 pgs.
"Drive Image Professional," WSDC Download Guide, http://wsdcds01.watson.ibm.com/wsdc.nsf/Guides/Download/Applications-DriveImage.htm, accessed May 3, 2001, 5 pgs.
Electronic Engineering Times, Issue 759, Aug. 16, 1993, 37 pgs.
Adaptive Lossless Data Compression—ALDC, IBM, Jun. 15, 1994, 2 pgs.
ALDC1-5S—Adaptive Lossless Data Compression, IBM Microelectronics, May 1994, 2 pgs.
ALDC1-20S—Adaptive Lossless Data Compression, IBM Microelectronics, May 1994, 2 pgs.
ALDC1-40S—Adaptive Lossless Data Compression, IBM Microelectronics, May 1994, 2 pgs.
ALDC-MACRO—Adaptive Lossless Data Compression, IBM Microelectronics, May 1994, 2 pgs.
Craft, David J., "Data Compression Choice No Easy Call," Computer Technology Review, Jan. 1994, 2 pgs.
"Data Compression Applications and Innovations Workshop," Proceedings of a Workshop held in conjunction with the IEEE Data Compression Conference, Mar. 31, 1995, 123 pgs.
IBM Microelectronics Comdex Fall 1993 Booth Location, 1 pg.
"IBM Technology Products Introduces New Family of High-Performance Data Compression Products," IBM Corporation, Somers, NY, Aug. 16, 1993, 6 pgs.
Zebrose, Katherine L., "Integrating Hardware Accelerators into Internetworking Switches," Telco Systems, Nov. 1993, 10 pgs.
Readme, Powerquest Corporation (1994-2002), 6 pgs.
Costlow, Terry "Sony designs faster, denser tape drive," Electronic Engineering Times, May 20, 1996, 2 pgs.
Electronic Engineering Times, Issue 767, Oct. 11, 1993, 34 pgs.
"IBM Announces New Feature for 3480 Subsystem," Tucson Today, vol. 12, No. 337, Jul. 25, 1989, 1 pg.
Craft, D.J. "A fast hardware data compression algorithm and some algorithmic extension," IBM Journal of Research and Development, vol. 42, No. 6, Nov. 1998, 14 pgs.
"Magstar and IBM 3590 High Performance Tape Subsytem Technical Guide," IBM, Nov. 1996, 288 pgs.

Transmission Control Protocol Darpa Internet Program Protocol Specification, Sep. 1981, RFC 793, http://www.apps.ietf.org/rfc/rfc793.html, accessed Aug. 5, 2009.
"AppCelera: Smart Compression". eWEEK.com, Ziff Davis Publishing Holdings Inc., pp. 1-11, © 1996-2006. Can be found at http://www.eweek.com/article2/0,1759,755242,00.asp.
"Data compression—Wikipedia, the free encyclopedia", Wikipedia, pp. 1-7, Dec. 6, 2005. Can be found at http://en.wikipedia.org/wiki/Data_compression_algorithm.
"Data compression ratio—Wikipedia, the free encyclopedia", Wikipedia, pp. 1-2, Dec. 6, 2005. Can be found at http://en.wikipedia.org/wiki/Data_compression_ratio.
"Gzip—Wikipedia, the free encyclopedia", Wikipedia, pp. 1-4, Dec. 6, 2005. Can be found at http://en.wikipedia.org/wiki/Gzip.
"HTTP Compression Speeds up the Web What is IETF Content-Encoding (or HTTP Compression)?" pp. 1-5. Can be found at http://webreference.com/internet/software/servers/http/compression/2.html, Apr. 2002.
"HTTP Compression Speeds up the Web", pp. 1-5. Can be found at http://webreference.com/internet/software/servers/http/compression/, Apr. 2002.
"HTTP Compression", pp. 1-5, Last modified Jan. 17, 2006. Can be found at http://websiteoptimization.com/speed/tweak/compress/.
Berners-Lee, T., et al., "Hypertext Transfer Protocol—HTTP/1.0", IETF, RFC 1945, pp. 1-23, May 1996.
Deutsch, P. and Gailly, J., "ZLIB Compressed Data Format Specification version 3.3", IETF, RFC 1950, pp. 1-11, May 1996.
Deutsch, P. "DEFLATE Compressed Data Format Specification version 1.3", IETF, RFC 1951, pp. 1-17, May 1996.
Deutsch, P., "GZIP file format specification version 4.3", IETF, RFC 1952, pp. 1-12, May 1996.
F5 Networks, Inc., "Configuration Guide for Local Traffic Management" Version 9.0, MAN-0122-01, Chapter 6, pp. 1-26, © 1996-2005.
Fielding, R., et al. "Hypertext Transfer Protocol—HTTP/1.1", IETF, RFC 2616, pp. 1-18, Jun. 1999.
Friend, R. and Monsour, R., "IP Payload Compression Using LZS", IETF, RFC 2395, pp. 1-9, Dec. 1998.
Gailly, J. and Adler, M., "The gzip home p.", pp. 1-8, Last updated Jul. 27, 2003. Can be found at http://www.gzip.org.
Gailly, J. and Adler, M., "zlib 1.1.4 Manual", pp. 1-14, Mar. 11, 2002. Can be found at http://www.zlib.net/manual.html.
Gailly, J. "gzip the data compression program", Edition 1.2.4 for Gzip Version 1.2.4, pp. 1-13, Jul. 1993. Can be found at http://www.gnu.org/software/gzip/manual/html_mono/gzip.html.
Gailly J., "Invoking gzip", pp. 1-2, Jul. 1993. Can be found at http://www.math.utah.edu/docs/info/gzip_4.html#SEC7.
Gailly, J., "Overview", pp. 1-2, Jul. 1993. Can be found at http://www.math.utah.edu/docs/info/gzip_2.html#SEC5.
Heath, J. and Border, J., "IP Payload Compression Using ITU-T V.44 Packet Method", IETF, RFC 3051, pp. 1-8, Jan. 2001.
Jeannot, Emmanuel, et al., "Adaptive Online Data Compression", 11th IEEE International Symposium on High Performance Distributed Computing, pp. 1-57, 2002.
Krintz, Chandra and Sucu, Sezgin, "Adaptive on-the-Fly Compression", IEEE Computer Society, vol. 17, No. 1, pp. 1-2, Jan. 2006. Can be found at http://csdl2.computer.org/persagen/DLAbsToc.jsp?resourcePath=/dl/trans/td/ &toc=comp/trans/td/2006/01/l1toc.xml&DOI=10.1109/TPDS.2006.3.
Leurs, L., "Flate/deflate Compression", pp. 1-2, © 2000. Can be found at http://prepressure.com/techno/compressionflate.htm.
Pereira, R., "IP Payload Compression Using DEFLATE", IETF, RFC 2394, pp. 1-6, Dec. 1998.
Official Communication for U.S. Appl. No. 13/426,005 mailed Jan. 17, 2013.

* cited by examiner

ADAPTIVE COMPRESSION

CROSS-REFERENCE TO RELATED APPLICATIONS

This utility patent application is a Continuation of U.S. patent application Ser. No. 11/243,629 entitled "Adaptive Compression," filed on Oct. 5, 2005, the benefit of which is claimed under 35 U.S.C. §120, and U.S. Provisional Patent Application Ser. No. 60/706,155 entitled "Adaptive Document Compression," filed on Aug. 5, 2005, the benefit of which is claimed under 35 U.S.C. §119(e), which are both incorporated herein by reference.

FIELD OF THE INVENTION

The invention relates generally to communicating content over a network, and more particularly but not exclusively to adaptively compressing content that may be communicated over a network.

BACKGROUND OF THE INVENTION

According to some studies, the volume of information over a network, such as the Internet, is expected to more than triple over the next three years. Data and content is likely to remain the largest percentage of Internet traffic, with the majority of this information being dynamic. Often, the issues of concern with Internet traffic range from business to consumer response and order times, to the time required to deliver business information to a traveler using a wireless device, to the download time for rich media such as music, videos, and so forth. Thus, not surprisingly, a major complaint among Internet users is a lack of speed. Additionally, users' complaints often center on how long it takes to display a web page, or other content, on their computing device. One solution therefore, may be to send less data. This is where compression may help.

The idea is to compress data being sent from a server, and to have a client's browser decompress this data upon receipt, thereby reducing the amount of data sent over the Internet, and increasing a web page display speed. Many, although not all, browsers are now equipped to support the Hypertext Transfer Protocol (HTTP) modes that enable compression. While compression typically reduces the size of a file sent over the Internet, it may often be difficult to determine the resultant size of the compressed file until it has been compressed. Unfortunately, there are numerous applications that may need to know this resultant size a priori to the compression. One such example involves client connection 'keep-alives,' where multiple client requests may be sent over the same network connection. To perform such action, a client may need to know a file length to know when one response is complete and another request may be issued. Although a protocol header sent over the Internet with the file may include length information, such length information may not be correct when compression is performed on the fly. Thus, it is with respect to these considerations and others that the present invention has been made.

BRIEF DESCRIPTION OF THE DRAWINGS

Non-limiting and non-exhaustive embodiments of the invention are described with reference to the following drawings. In the drawings, like reference numerals refer to like parts throughout the various figures unless otherwise specified.

For a better understanding of the invention, reference will be made to the following Detailed Description of the Invention, which is to be read in association with the accompanying drawings, wherein.

DETAILED DESCRIPTION OF THE INVENTION

Figure 1:
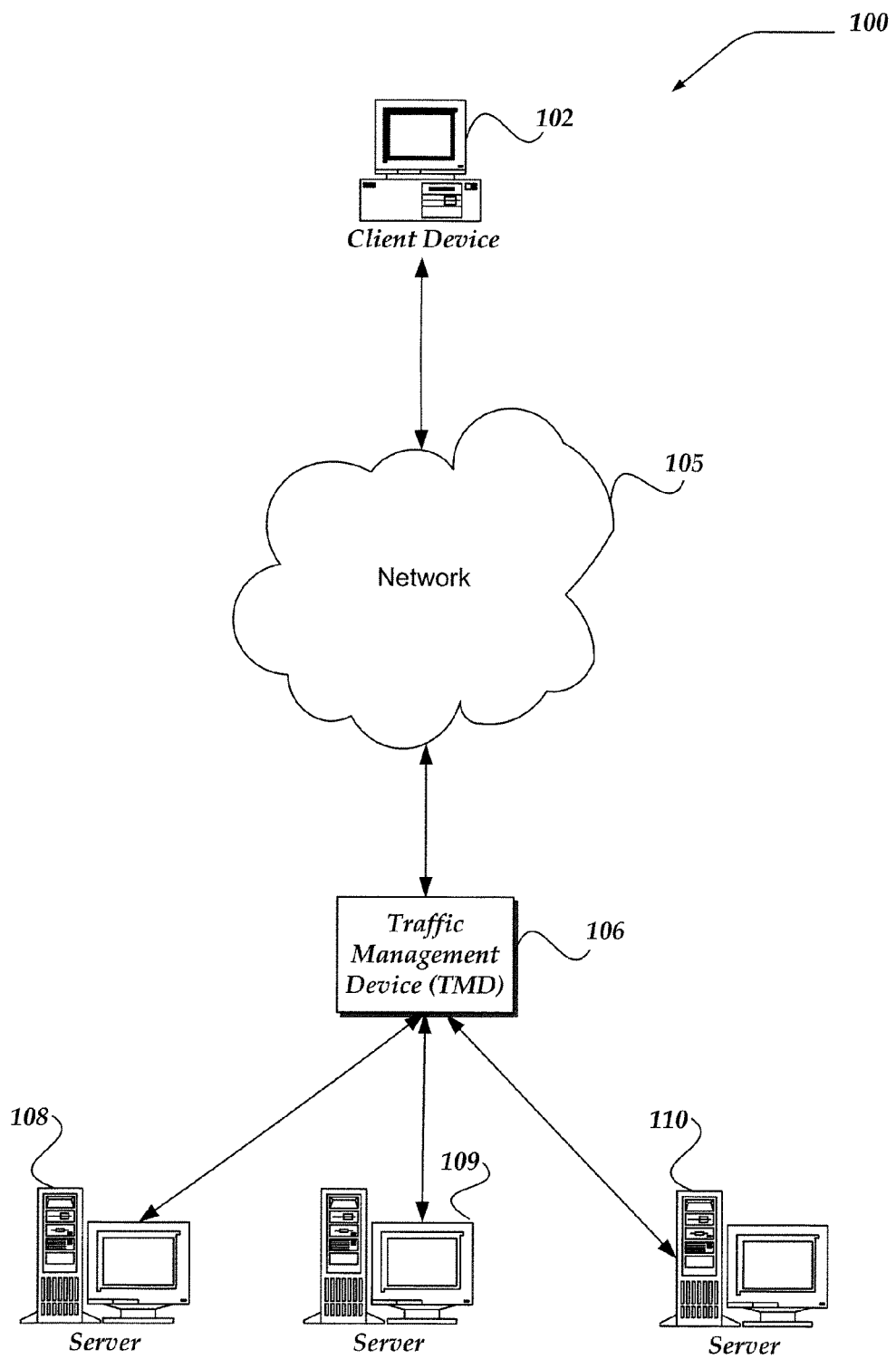
FIG. 1 shows a functional block diagram illustrating an environment for practicing the invention.

The invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the invention may be embodied as methods or devices. Accordingly, the invention may take the form of an entirely hardware embodiment, an entirely software embodiment or an embodiment combining software and hardware aspects. The following detailed description is, therefore, not to be taken in a limiting sense.

Throughout the specification and claims, the following terms take the meanings explicitly associated herein, unless the context clearly dictates otherwise. The phrase "in one embodiment" as used herein does not necessarily refer to the same embodiment, though it may. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Briefly stated, the invention is directed towards a system, apparatus, and method for managing an acceleration of a compression of content over a network. In one embodiment, a request for content may be provided to a server over a network, using a protocol such as HTTP. The content may include content length information, such as within a protocol header. In one embodiment, a portion of the content may be compressed to approximately fill a buffer using a selected compression mode. In one embodiment, the selected compression mode employs maximum compression on the portion of the content. Maximum compression may be defined as a highest level of compression selectable for a given compression mechanism, and/or a content type. Thus, for example, employing gzip, a maximum level of compression (for example, gzip –9) may result in using an iterative dynamic programming algorithm to compress the portion of the content. As used herein, the term compression mode may refer to a compression algorithm, or a parameter or factor used during compression that distinguishes the resulting compressed data. For example, in the gzip utility, a command line argument regulates the compression speed, resulting in a regulation of the compression level.

If there remains additional content that is uncompressed, it might be compressed using another compression mode, such as an identity compression mode. Identity compression mode arises where the content is encoded as uncompressed blocks, but may maintain compression mode type of headers, and/or similar packet wrappers. Identity compression mode may therefore represent a zero compression. For example, using the zlib library, identity compression may be 'forced.' As used herein, the term "compression" refers to the processing of data into a compression format, even if the compressed size is not reduced from the original size. If the identity compression mode is used, a new content length may be determined based in part on the length of the compressed content and the remaining content to be encoded. The buffered content and the new content length may then be forwarded in response to the request.

By buffering the entire result or by compressing the initial portion of the document and then encoding the remainder as uncompressed blocks, using identity compression, the content length of the resulting content may be known a priori to sending the content in response to the request. This thereby enables such activities as client connection keep alives, and so forth, to receive a correct content length. The invention may further improve performance of embedded systems, or the like, that may employ fixed size buffers.

Illustrative Operating Environment

FIG. 1 illustrates an environment in which the invention may operate. However, not all of these components may be required to practice the invention, and variations in the arrangement and type of the components may be made without departing from the spirit or scope of the invention.

As shown in the figure, system 100 includes client device 102, network 105, traffic management device (TMD) 106, and servers 108-110. Client device 102 is in communication with TMD 106 through network 105. TMD 106 is in further communication with servers 108-110. Although not shown, TMD 106 may be in communication with servers 108-110 through a network infrastructure that is similar to network 105. For example, in one embodiment, TMD 106, and servers 108-110 might reside within a common local area network type of infrastructure, although the invention is not constrained to such a configuration.

Generally, client device 102 may include virtually any computing device capable of connecting to another computing device and receiving information. Such devices may also include portable devices such as, cellular telephones, smart phones, display pagers, radio frequency (RF) devices, infrared (IR) devices, Personal Digital Assistants (PDAs), handheld computers, wearable computers, tablet computers, integrated devices combining one or more of the preceding devices, and the like. Client device 102 may also include other computing devices, such as personal computers, multiprocessor systems, microprocessor-based or programmable consumer electronics, network devices, and the like. As such, client device 102 may range widely in terms of capabilities and features. For example, a client device configured as a cell phone may have a numeric keypad and a few lines of monochrome LCD display on which only text may be displayed.

In another example, a web-enabled client device may have a touch sensitive screen, a stylus, and several lines of color LCD display in which both text and graphics may be displayed. Moreover, the web-enabled client device may include a browser application enabled to receive and to send wireless application protocol messages (WAP), and/or wired application messages, and the like. In one embodiment, the browser application is enabled to employ HyperText Markup Language (HTML), Dynamic HTML, Handheld Device Markup Language (HDML), Wireless Markup Language (WML), WMLScript, JavaScript, EXtensible HTML (xHTML), Compact HTML (CHTML), and the like, to display and send a message. Moreover, the browser application may also be enabled to receive compressed files using any of a variety of compression mechanisms, including, but not limited to gzip as described in Request for Comments (RFC) 1952 (available at http://www.ietf.org/rfc/rfc1952.txt?number=1952), deflate as described in RFC 1951 (available at http://www.ietf.org/rfc/rfc1951.txt?number=1951), zlib as described in RFC 1950 (available at http://www.ietf.org/rfc/rfc1950.txt?number=1950), each of which is incorporated by reference, as well as other mechanisms, such as glib-deflate, or the like.

Client device 102 also may include at least one client application that is configured to receive content from another computing device. The client application may include a capability to provide and receive textual content, graphical content, audio content, alerts, messages, and the like. Moreover, client device 102 may be further configured to communicate a message, such as through a Short Message Service (SMS), Multimedia Message Service (MMS), instant messaging (IM), internet relay chat (IRC), mIRC, Jabber, and the like, between another computing device, and the like.

In one embodiment, client device 102 may be configured such that an end-user may operate the computing device to make requests for data and/or services from other computers on the network. In one embodiment, client device 102 may employ a network interface unit (sometimes called a transceiver), such as described below, to communicate information with another computing device. Often, the requested data resides in computing devices such as servers 108-110. In this specification, the term "client" refers to a computer's general role as a requester of data or services, and the term "server" refers to a computer's role as a provider of data or services. In general, it is possible that a computer can act as a client, requesting data or services in one transaction and act as a server, providing data or services in another transaction, thus changing its role from client to server or vice versa. In one embodiment, client device 102 is a computing device that is not operated by an end-user.

Network 105 is configured to couple one computing device with another computing device. Network 105 may be enabled to employ any form of computer readable media for communicating information from one electronic device to another. Also, network 105 can include the Internet in addition to local area networks (LANs), wide area networks (WANs), direct connections, such as through a universal serial bus (USB) port, other forms of computer-readable media, or any combination thereof. On an interconnected set of LANs, including those based on differing architectures and protocols, a router acts as a link between LANs, enabling messages to be sent from one to another. Also, communication links within LANs typically include twisted wire pair or coaxial cable, while communication links between networks may utilize analog telephone lines, full or fractional dedicated digital lines including T1, T2, T3, and T4, Integrated Services Digital Networks (ISDNs), Digital Subscriber Lines (DSLs), wireless links including satellite links, or other communications links known to those skilled in the art. Furthermore, remote computers and other related electronic devices could be remotely connected to either LANs or WANs via a modem and temporary telephone link.

Network 105 may further include any of a variety of wireless sub-networks that may further overlay stand-alone ad-hoc networks, and the like, to provide an infrastructure-oriented connection. Such sub-networks may include mesh networks, Wireless LAN (WLAN) networks, cellular networks, and the like. Network 105 may also include an autonomous system of terminals, gateways, routers, and the like connected by wireless radio links, and the like. These connectors may be configured to move freely and randomly and organize themselves arbitrarily, such that the topology of network 105 may change rapidly.

Network 105 may further employ a plurality of access technologies including 2nd (2G), 2.5, 3rd (3G), 4th (4G) generation radio access for cellular systems, WLAN, Wireless Router (WR) mesh, and the like. Access technologies such as 2G, 3G, and future access networks may enable wide area coverage for mobile devices with various degrees of mobility. For example, network 105 may enable a radio connection through a radio network access such as Global System for Mobile communication (GSM), General Packet Radio Services (GPRS), Enhanced Data GSM Environment (EDGE), Wideband Code Division Multiple Access (WCDMA), CDMA2000, and the like. In essence, network 105 may include virtually any wired and/or wireless communication mechanisms by which information may travel between one computing device and another computing device, network, and the like.

Additionally, communication media typically embodies computer-readable instructions, data structures, program modules, or other data in a modulated data signal such as a carrier wave, data signal, or other transport mechanism and includes any information delivery media. The terms "modulated data signal," and "carrier-wave signal" includes a signal that has one or more of its characteristics set or changed in such a manner as to encode information, instructions, data, and the like, in the signal. By way of example, communication media includes wired media such as twisted pair, coaxial cable, fiber optics, wave guides, and other wired media and wireless media such as acoustic, RF, infrared, and other wireless media.

TMD 106 may include virtually any device that manages network traffic. Such devices include, for example, routers, proxies, firewalls, load balancers, cache devices, devices that perform network address translation, any combination of the preceding devices, and the like. TMD 106 may, for example, control the flow of data packets delivered to and forwarded from an array of servers, such as servers 108-110. TMD 106 may direct a request for a resource to a particular server based on network traffic, network topology, capacity of a server, content requested, and a host of other traffic distribution mechanisms. TMD 106 may receive data packets from and transmit data packets to the Internet, an intranet, or a local area network accessible through another network. TMD 106 may recognize packets that are part of the same communication, flow, and/or stream and may perform special processing on such packets, such as directing them to the same server so that state information is maintained. TMD 106 also may support a wide variety of network applications such as Web browsing, email, telephony, streaming multimedia and other traffic that is sent in packets.

TMD 106 may receive requests from client device 102. TMD 106 may select a server from servers 108-110 to forward the request. TMD 106 may employ any of a variety of criteria and mechanisms to select the server, including those mentioned above, load balancing mechanisms, and the like. TMD 106 is further configured to receive a response to the request and to forward the response to client device 102.

TMD 106 may also perform adaptive compression of at least a portion of the response to the request as it is being forwarded to client device 102. TMD 106 may select a compression mode to initially compress at least a portion of the response, and based on the results of the compression of the portion, employ an identity compression mode to compress the remaining portion of the response. TMD 106 may also employ processes substantially similar to those described below in conjunction with FIGS. 3-4 to perform at least some of its actions.

TMD 106 may be implemented using one or more personal computers, servers, multiprocessor systems, microprocessor-based or programmable consumer electronics, network PCs, radio frequency (RF) devices, infrared (IR) devices, integrated devices combining one or more of the preceding devices, and the like. Such devices may be implemented solely in hardware or in hardware and software. For example, such devices may include some application specific integrated circuits (ASICs) coupled to one or more microprocessors. The ASICs may be used to provide a high-speed switch fabric while the microprocessors may perform higher layer processing of packets. An embodiment of a network device that could be used as TMD 106 is network device 200 of FIG. 2, configured with appropriate software. The BIG-IP® family of traffic managers, by F5 Networks of Seattle, Wash., are examples of TMDs.

Servers 108-110 may include any computing device capable of communicating packets with client computer 102 to provide a response to a request for data and/or services. Each packet may convey a piece of information. A packet may be sent for handshaking, i.e., to establish a connection or to acknowledge receipt of data. The packet may include information such as a request, a response, or the like. Generally, packets received by servers 108-110 will be formatted according to TCP/IP, but they could also be formatted using another transport protocol, such as User Datagram Protocol (UDP), Internet Control Message Protocol (ICMP), NETbeui, IPX/SPX, token ring, and the like. Moreover, the packets may be communicated between servers 108-110, TMD 106, and client device 102 employing HTTP, HTTPS, and the like.

In one embodiment, servers 108-110 are configured to operate as a website server. However, servers 108-110 are not limited to web servers, and may also operate a messaging server, a File Transfer Protocol (FTP) server, a database server, content server, and the like. Additionally, each of servers 108-110 may be configured to perform a different operation. Thus, for example, server 108 may be configured as a messaging server, while server 109 is configured as a database server. Moreover, while servers 108-110 may operate as other than a website, they may still be enabled to receive an HTTP communication.

Devices that may operate as servers 108-110 include personal computers desktop computers, multiprocessor systems, microprocessor-based or programmable consumer electronics, network PCs, servers, and the like.

Although the above configuration illustrates compression acceleration being performed within TMD 106, the invention is not so limited. Thus, in one embodiment, the compression acceleration may also be performed with at least one of servers 108-110, and/or a server and TMD 106, without departing from the scope or spirit of the invention.

Illustrative TMD Environment

Figure 2:
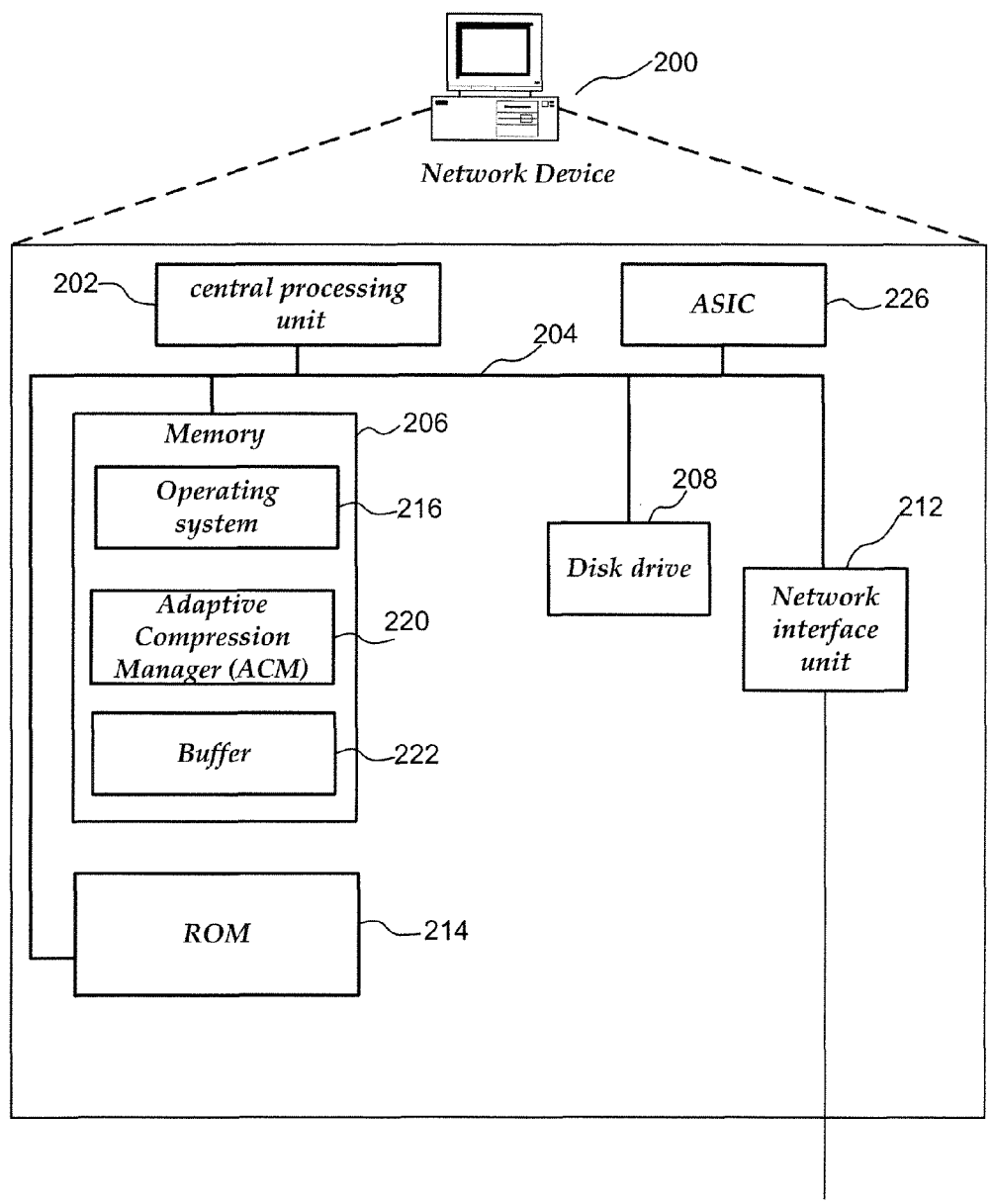
FIG. 2 shows one embodiment of a network device that may be included in a system implementing the invention.

FIG. 2 shows an exemplary network device 200 that may operate as TMD 106 of FIG. 1. It will be appreciated that not all components of network device 200 are illustrated, and that network device 200 may include more or less components than those shown in FIG. 2.

As illustrated in FIG. 2, network device 200 includes a central processing unit (CPU) 202, mass memory, and a network interface unit 212 connected via a bus 204. Network interface unit 212 includes the necessary circuitry for connecting network device 200 to various networks, including network 105 of FIG. 1, and is constructed for use with various communication protocols including the TCP/IP and UDP/IP protocol. Network interface unit 212 may include or interface with circuitry and components for transmitting messages and data over a wired and/or wireless communications medium. Network interface unit 212 is sometimes referred to as a transceiver, Network Interface Card (NIC), or the like.

The mass memory generally includes random access memory ("RAM") 206, read-only memory ("ROM") 214, and one or more permanent mass storage devices, such as hard disk drive 208. The mass memory stores operating system 216 for controlling the operation of network device 200. The operating system 216 may comprise an operating system such as UNIX, LINUX™, or Windows™. In one embodiment, the mass memory may store program code and data for implementing Adaptive Compression Manager (ACM) 220, and buffer 222.

Buffer 222 includes virtually any mechanism that is configured to receive and store content, including compressed content. In one embodiment, buffer 222 is illustrated within RAM 206; however, the invention is not so limited. For example, buffer 222 may also reside within disk drive 208, or the like, without departing from the scope of the invention. In one embodiment, buffer 222's size is about 16K bytes, however, the invention is not so constrained to this size, and buffer 222 may have virtually any size based, in part, on any of a variety of criteria. For example, buffer 222's size may be selected based on information about a typical size of files sent from a server.

ACM 222 may be configured to manage adaptive compression of content over a network. ACM 222 may receive a file from another device. Such files may include any of a variety of data and data formats, including documents, applications, movies, videos, music, audios, still images, text, graphics, and so forth.

ACM 222 may select to compress at least a portion of the received file. In one embodiment, ACM 222 may select a compression mode to compress at least the portion of the file into a temporary store, such as buffer 222, or the like. Then, based on whether the file can be completely compressed into buffer 222, ACM 222 may select to employ another compression mode, such as the identity compression mode, to compress a remaining portion of the file, where the remaining portion is that portion of the file that remains after the buffer is approximately full with compressed data from the first portion. Moreover, ACM 222 may adjust a value that indicates a length of the file. The value may be located in a protocol header. In one embodiment, the value is a content length value that is capable of being included in a protocol header such as the HTTP Content-Length header field. The HTTP Content-Length header field is described in RFC 2616, available at http://www.ietf.org/rfc/rfc2616.txt. ACM 222 may employ processes such as those described below in conjunction with FIGS. 3-4 to perform at least some of its actions.

In one embodiment, network device 200 includes one or more Application Specific Integrated Circuit (ASIC) chip 226 connected to bus 204. As shown in FIG. 2, network interface unit 212 may connect to 204 bus through at least one ASIC chip. ASIC chip 226 can include logic that enables at least some of the actions of network device 200. For example, in one embodiment, ASIC chip 226 can be employed to perform packet processing functions on incoming and/or outgoing packets. In one embodiment, ASIC chip 226 performs logic for network monitor 220 and/or redirect coordinator 224. In one embodiment, network device 200 includes one or more field-programmable gate arrays (FPGA) (not shown), instead of, or in addition to, ASIC chip 226. A number of actions for the network device can be performed by ASIC chip 226, an FPGA, CPU 202 with instructions stored in memory, or any combination of actions performed by the ASIC chip, FPGA, and CPU.

Computer storage media may include volatile and nonvolatile, removable and non-removable media implemented in any method or technology for storage of information, such as computer readable instructions, data structures, program modules or other data. Examples of computer storage media include RAM 206, ROM 214, EEPROM, flash memory and/or any other memory architecture, CD-ROM, digital versatile disks (DVD) and/or any other optical storage, magnetic cassettes, magnetic tape, magnetic disk storage and/or any other magnetic storage devices, and/or any other medium that can store information that can be accessed by a computing device.

Network device 200 may also include an input/output interface (not shown) for communicating with external devices or users.

Network device 200 can also be implemented as one or more "blades" where the term "blade" refers to one of multiple electronic circuit boards or cards that are installed in a hardware chassis with a backplane. An exemplary blade may include one or more processors, volatile and non-volatile memory, interfaces suitable for communicating information to and from the blade, and other components for enabling the operation of one or more applications. A blade may also include a specialized interface for the backplane and other interfaces, such as a USB port, FIREWIRE port, serial port, RF interface, IR interface, Ethernet interface, IDE controller, and the like. An application running on a blade may employ any of these interfaces to communicate information to other applications running on other blades and/or devices coupled to the blade server. Network device 200 can also be implemented as a combination of blades and additional components in the chassis.

Generalized Operation

Figure 3:
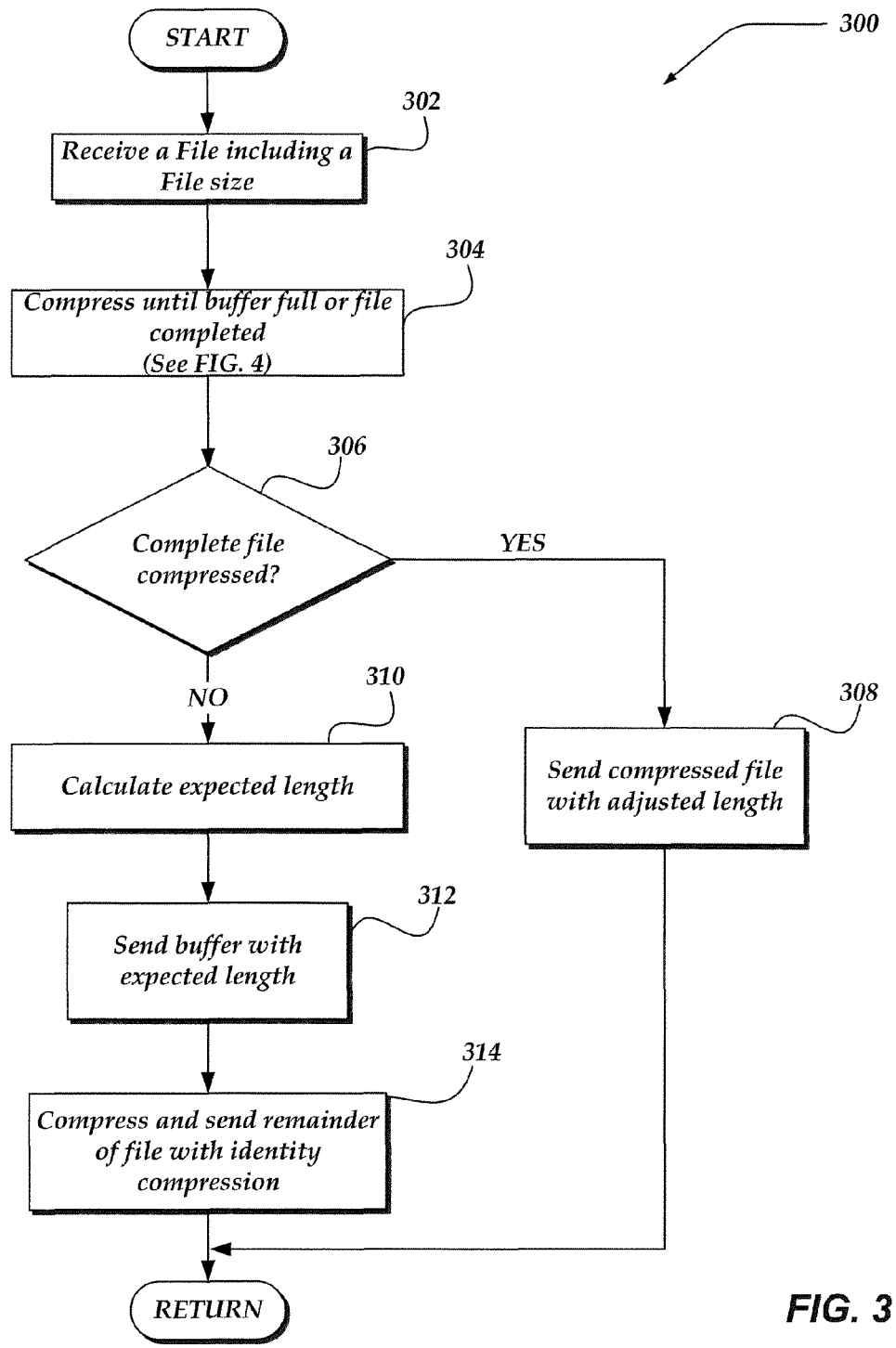
FIG. 3 illustrates a logical flow diagram generally showing one embodiment of a process for accelerating compression of content on the fly using a buffer.

The operation of certain aspects of the invention will now be described with respect to FIGS. 3-4. FIG. 3 illustrates a logical flow diagram generally showing one embodiment of a process for accelerating compression of content using a buffer.

Process 300 of FIG. 3, begins, after a start block, at block 302 where a file is received, including information associated with the file, such as its size. Processing flows next to block 304, which is described in more detail below in conjunction with FIG. 4. Briefly, however, at block 304 a compression mode is selected and is employed to attempt to compress the file into a buffer. The result of block 304 is that either the complete file may be compressed into the buffer using the selected compression, or the buffer size is determined to have been exceeded before the complete file is compressed into the buffer. In either event, processing then flows to decision block 306.

At decision block 306 a determination is made whether the complete file is compressed into the buffer. In one embodiment, the buffer may be about 16K bytes. However, the invention is not limited to this size, and the buffer size may be set to virtually any size, without departing from the scope or spirit of the invention. If the complete file is compressed into the buffer, processing branches to block 308; otherwise, processing flows to block 310.

At block 308, an adjusted file length based on the selected compression is determined. In one embodiment, the adjusted file length may be determined as:

ADJUSTED FILE LENGTH=$C+T$, where C represents the compressed size of the data processed, which in this instance is the entire compressed file; and T represents a size of any compression trailers that may be included. The adjusted file length may then be employed to modify length information in a header, such as HTTP content-length information in a protocol header, or the like, that is associated with the compressed file.

At block 308, the compressed file, including the adjusted file length is then sent to a destination. Process 300 of FIG. 3 then returns to a calling process to perform other actions.

At block 310, however, it is determined that the file is not completely compressed. This may arise, for example, where the buffer size is exceeded before the entire file may be compressed into the buffer. Thus, at block 310, an expected file length of the file based on another compression mode is determined. In one embodiment, the other compression mode is the identity compression mode. In one embodiment, the expected file length may be determined using the following:

EXPECTED FILE LENGTH=$C+T$+(Roundup($R/B$)*$O$)+$R$, where C represents the size of the processed (compressed) data (which may be approximately the size of the buffer); T represents the size of any compression trailers; and R represents the amount of data in the file remaining that is to be compressed using the identity compression. That is, R=S—(the amount of data compressed so far), where S then represents the size of the original file. B represents a block size into which another portion of the file is compressed. In one embodiment, B may be about 4096 bytes. However, virtually any block size may be employed. For example, in one embodiment, B is about the same size as the buffer. In addition, O represents a size of a block header. In one embodiment, O is about 5 bytes. The file length that is determined at block 310 is termed an expected file length at least because, at the time that the file length is determined, a remaining portion exists that has not yet been processed into compression blocks.

Processing then continues to block 312, wherein the compressed portion of the file in the buffer, including the expected file length is sent to the destination. Next, processing continues to block 314, where the remaining portion of the file that exceeded the buffer is then compressed using the second compression mode. In one embodiment, the second compression mode is the identity compression mode. In one embodiment, the uncompressed portion of the file may be compressed using fixed-size blocks of size B, as noted above. More than one fixed-size block may be employed to complete the compression of the remaining portion of the uncompressed file. In one embodiment, where there are multiple fixed-size blocks, each block is sent to the destination as it is generated, virtually on the fly. In another embodiment, the multiple fixed-size blocks are generated, and then each are sent in turn towards the destination. In any event, upon completion of block 314, process 300 returns to the calling process to perform other actions. In one embodiment, the blocks used are not of a fixed-size.

Figure 4:
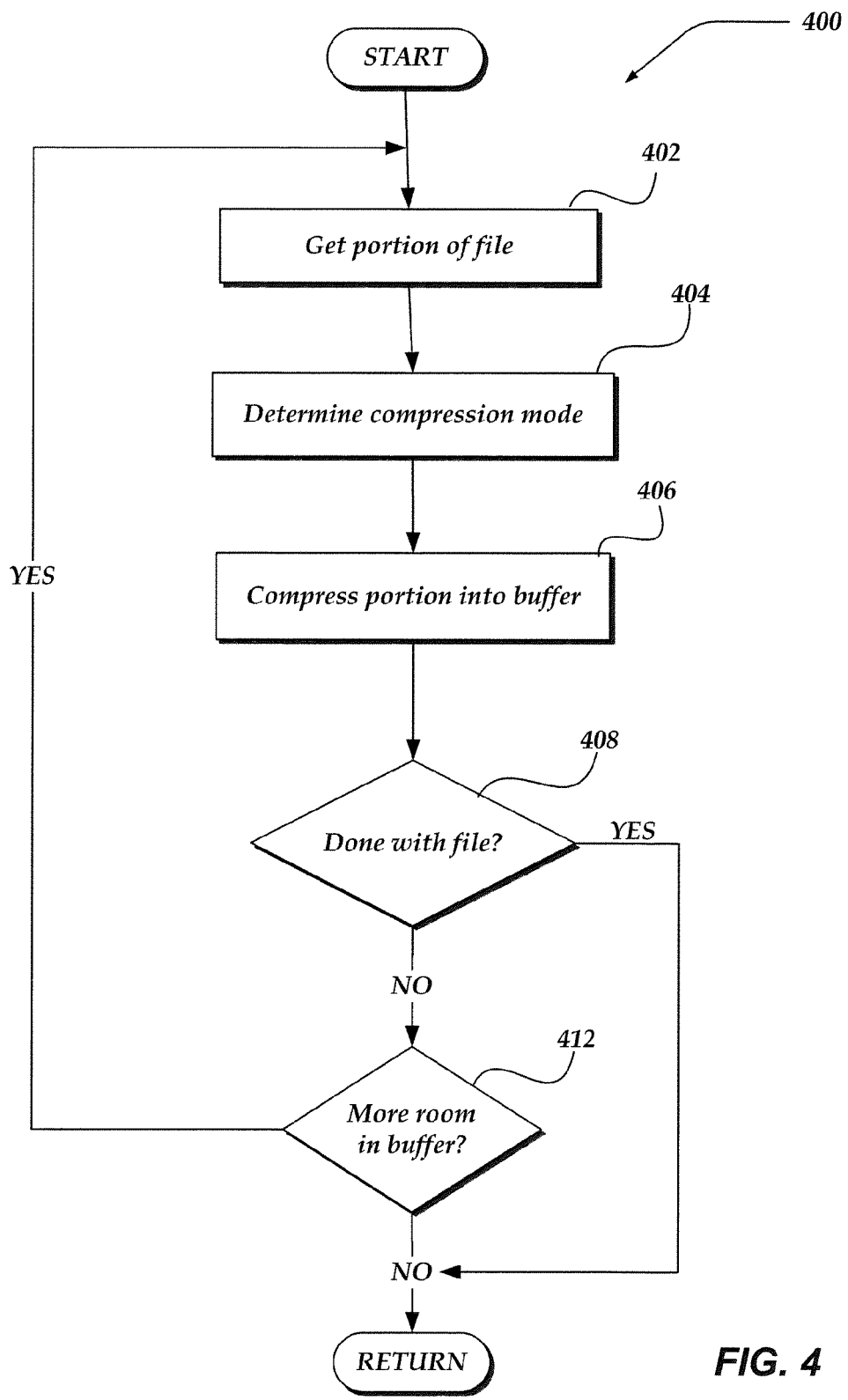
FIG. 4 illustrates a logical flow diagram generally showing one embodiment of a process for compressing the content into the buffer, in accordance with the invention.

FIG. 4 illustrates a logical flow diagram generally showing one embodiment of a process for compressing the content into a buffer, in accordance with the invention. In one embodiment, process 400 of FIG. 4 may represent block 304 of FIG. 3.

Process 400 of FIG. 4, begins, after a start block, at block 402, where a file is received, including information associated with the file such as its size. Processing flows next to block 404 where a compression mode is selected. Selection of the compression mode may include employing various compression mechanisms, including gzip or the like. In one embodiment the selected compression mode may employ a maximum compression. However, the invention is not so constrained.

Processing continues to block 406, where at least a portion of the received file may be compressed into a buffer. In one embodiment, the buffer may be a fixed-size buffer of about 16K bytes. However, the invention is not limited to this size, and may be set to virtually any size, without departing from the scope or spirit of the invention. A fixed-size buffer refers to a buffer having a size that remains approximately the same at least during the process of compressing a file.

Processing then flows to decision block 408 where a determination is made whether the file is done. That is, has the file been completely compressed? If it is determined that the file is completely done, processing returns to a calling process to perform other actions. In one embodiment, the process returns to block 304 of FIG. 3.

However, if at decision block 408, it is determined that the file is incompletely compressed into the buffer, processing continues to decision block 412 where a determination is made whether there remains sufficient unused space within the buffer to attempt to compress another portion of the file into it. Although there may be some unused space within the buffer, it may not be sufficient, due to block sizing, or various other limitations, to enable another portion of the file to be compressed into the buffer. Thus, the invention also takes into account such variables. In any event, if it is determined that there is insufficient space in the buffer into which another portion of the file may be compressed, processing returns to the calling process to perform other actions. In one embodiment, the process returns to block 304 of FIG. 3. However, if it is determined that sufficient space is available into which another portion of the file may be compressed, processing loops back to block 402 to obtain another portion of the file. This process may continue until the buffer is determined to be exceeded or the file is completely compressed into the buffer.

It will be understood that each block of the flowchart illustration, and combinations of blocks in the flowchart illustration, can be implemented by computer program instructions. These program instructions may be provided to a processor to produce a machine, such that the instructions, which execute on the processor, create means for implementing the actions specified in the flowchart block or blocks. The computer program instructions may be executed by a processor to cause a series of operational steps to be performed by the processor to produce a computer implemented process such that the instructions, which execute on the processor to provide steps for implementing the actions specified in the flowchart block or blocks.

Accordingly, blocks of the flowchart illustration support combinations of means for performing the specified actions, combinations of steps for performing the specified actions and program instruction means for performing the specified actions. It will also be understood that each block of the flowchart illustration, and combinations of blocks in the flowchart illustration, can be implemented by special purpose hardware-based systems which perform the specified actions or steps, or combinations of special purpose hardware and computer instructions.

The above specification, examples, and data provide a complete description of the manufacture and use of the composition of the invention. Since many embodiments of the invention can be made without departing from the spirit and scope of the invention, the invention resides in the claims hereinafter appended.

What is claimed as new and desired to be protected by Letters Patent of the United States is:

1. A non-transitory computer-readable storage medium having computer-executable instructions for use in communicating a file between a client and a server over a network, the computer-executable instructions comprising program code for performing actions comprising:
   receiving a file having a file length and a header having a file length number representing the file length;
   compressing at least a portion of the file using a first compression mode;
   determining an expected file length based, in part, on a second compression mode, wherein the expected file length is less than the received file length number and is based on another portion of the file that is currently uncompressed using the second compression mode, the second and first compression modes being different;
   sending the expected file length towards the client;
   after sending the expected file length toward the client, compressing at least some of the other portion of the file using the second compression mode; and
   sending the compressed portions of the file towards the client.

2. The non-transitory computer-readable storage medium of claim 1, wherein the expected file length is included in a packet header.

3. The non-transitory computer-readable storage medium of claim 1, wherein at least one of the compression modes employs a gzip compression mechanism.

4. The non-transitory computer-readable storage medium of claim 1, the actions further comprising, compressing at least another portion of the file using a third compression mode.

5. The non-transitory computer-readable storage medium of claim 1, the actions further comprising, prior to sending the expected file length, compressing at least another portion of the file using another compression mode, the other compression mode having a higher level of compression than at least the first compression mode.

6. The non-transitory computer-readable storage medium of claim 1, wherein compressing at least the portion of the file further comprises employing a buffer of a fixed-size.

7. An apparatus for managing a communication, comprising:
   a processor executing program code that:
      compresses at least a portion of a file into a buffer using a first compression mode;
      determines a file length such that when the file incompletely compresses into the buffer to determine an expected file length based on a remaining portion of the file that incompletely compresses into the buffer and prior to the remaining portion being compressed using a different compression mode, wherein determining the expected file length is based on a size of previously compressed portions, a size of remaining uncompressed portions, and at least one of a block header or size of a compression trailer; and
   a transceiver to receive the file over a network, and to send the expected file length and compressed portions of the file over the network.

8. The apparatus of claim 7, wherein determining the file length further determines the expected file length at least partly based on a use of an identity compression of a second portion of the file.

9. The apparatus of claim 7, the processor executing program code that further comprises a remaining portion of the file.

10. The apparatus of claim 7, wherein the buffer is a fixed-size buffer.

11. The apparatus of claim 7, wherein determining the file length selectively uses one or more different compression modes to compress the remaining portion of the file.

12. The apparatus of claim 7, wherein the transceiver receives the file from a first network device and sends the compressed portions of the file to a different second network device.

13. The apparatus of claim 7, wherein the first compression mode employs a maximum compression.

14. An apparatus for managing a communication between a client device and a server device, comprising:
   a processor having instructions that perform actions, including:
   compressing portions of a file by employing at least two different compression modes and determining an expected content length based on at least one of the compression modes and prior to completing the compression of the file, wherein determining the expected file length is based on a size of previously compressed portions, a size of remaining uncompressed portions, and at least one of a block header or size of a compression trailer; and
   a transceiver to receive the file over the network and to send the compressed portions of the file and to further send the expected content length over the network.

15. The apparatus of claim 14, wherein one of the at least two compression modes is an identity compression mode.

16. The apparatus of claim 14, wherein at least one of the two compression modes uses a fixed-size buffer.

17. The apparatus of claim 14, wherein first compression mode employed to compress at least a first portion of the file employs a maximum compression.

18. The apparatus of claim 14, wherein sending the compressed portions of the file and the expected content length further comprises using HTTP to send the compressed portions.

* * * * *